(12) United States Patent
Li (10) Patent No.: US 9,960,276 B2
(45) Date of Patent: May 1, 2018

(54) ESL TFT SUBSTRATE STRUCTURE AND MANUFACTURING METHOD THEREOF

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 214 days.

(21) Appl. No.: 14/764,169

(22) PCT Filed: Jun. 23, 2015

(86) PCT No.: PCT/CN2015/082012
§ 371 (c)(1),
(2) Date: Jul. 28, 2015

(87) PCT Pub. No.: WO2016/179882
PCT Pub. Date: Nov. 17, 2016

(65) Prior Publication Data
US 2017/0141238 A1    May 18, 2017

(30) Foreign Application Priority Data

May 14, 2015    (CN) .......................... 2015 1 0246193

(51) Int. Cl.
*H01L 27/12*        (2006.01)
*H01L 29/786*       (2006.01)
*H01L 29/24*        (2006.01)

(52) U.S. Cl.
CPC ...... *H01L 29/78618* (2013.01); *H01L 27/127* (2013.01); *H01L 27/1225* (2013.01);
(Continued)

(58) Field of Classification Search
CPC ................................................. H01L 29/78618
See application file for complete search history.

(56) References Cited

U.S. PATENT DOCUMENTS

2007/0138941 A1* 6/2007 Jin ...................... H01L 27/3232
                                                            313/503

FOREIGN PATENT DOCUMENTS

CN        102082179 A        6/2011
CN        103824862 A        5/2014

OTHER PUBLICATIONS

Machine Translation of CN103824862.*

* cited by examiner

*Primary Examiner* — Raj R Gupta
(74) *Attorney, Agent, or Firm* — Leong C. Lei (57) ABSTRACT

The present invention provides an ESL TFT substrate structure and a manufacturing method thereof. In the ESL TFT substrate structure, an etch stop layer (5) includes a first via (51) and a second via (52) formed therein to correspond to two side portions of an oxide semiconductor layer (4). A drain terminal (6) is set in engagement with the oxide semiconductor layer (4) through the first via (51). A passivation protection layer (7) includes a through hole (72) formed therein to extend to and communicate with the second via (52). An electrode layer (8) is formed on the passivation protection layer (7) and has a side portion that is adjacent to the drain terminal (6) and is set in engagement with the oxide semiconductor layer (4) through the through hole (72) and the second via (52) to form a source terminal (81) and an opposite side portion that is extended in a direction away from the drain terminal (6) to form a pixel electrode (82). The ESL TFT substrate structure has a reduced channel length so as to provide the TFT with excellent electrical conduction performance and also to (Continued)

reduce the size of the TFT thereby increasing an aperture ratio of pixels and reducing difficult of pixel design.

6 Claims, 6 Drawing Sheets

(52) U.S. Cl.
CPC .......... *H01L 27/1288* (2013.01); *H01L 29/24* (2013.01); *H01L 29/7869* (2013.01)

ESL TFT SUBSTRATE STRUCTURE AND MANUFACTURING METHOD THEREOF

BACKGROUND OF THE INVENTION

1. Field of the Invention

The present invention relates to the field of displaying technology, and in particular to an ESL (Etch Stop Layer) TFT (Thin-Film Transistor) substrate structure and a manufacturing method thereof.

2. The Related Arts

In the field of displaying technology, flat panel displays, such as liquid crystal displays (LCDs) and organic light-emitting diode (OLED) displays, are gradually taking the place of cathode ray tube (CRT) displays and are widely used in liquid crystal televisions, mobile phones, personal digital assistants, digital cameras, computer monitors, and notebook computer screens.

A display panel is an important component of LCDs and OLEDs. For display panels of both the LCDs and the OLEDs, they are often composed of a thin-film transistor (TFT) substrate. Taking an LCD display panel as an example, it is generally composed of a TFT substrate, a color filter (CF) substrate, and a liquid crystal layer interposed between the two substrates, of which the principle of operation is that a drive voltage is applied to the TFT substrate and the CF substrate to control molecules of the liquid crystal to rotate in order to refract out light from a backlight module for generating an image.

Currently, the known TFT substrates are generally classified in various types, including coplanar type, etch stop layer (ESL), and back channel etch (BCE).

Figure 1:
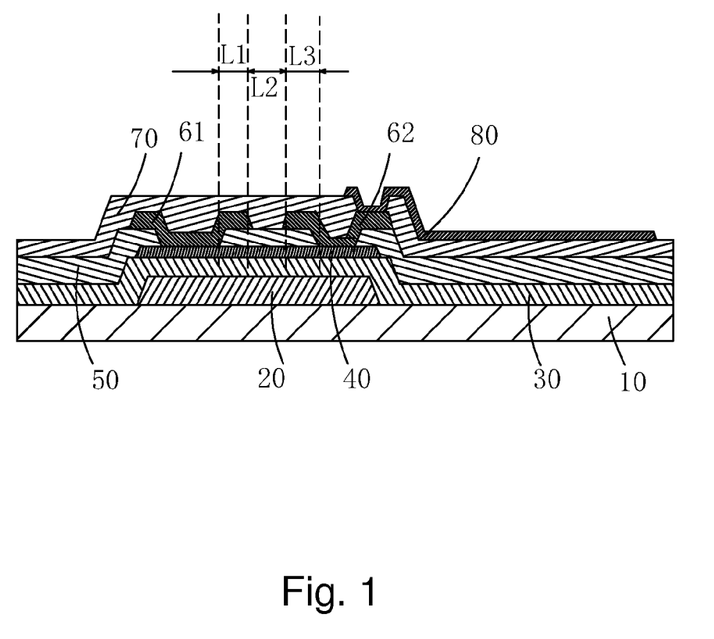
FIG. 1 is a cross-sectional view of a conventional ESL TFT substrate.

Referring to FIG. 1, a conventional ESL TFT substrate comprises a base plate 10 and a gate terminal 20, a gate insulation layer 30, an oxide semiconductor layer 40, an etch stop layer 50, a source terminal 60, a drain terminal 62, a passivation protection layer 70, and a pixel electrode 80 that are sequentially formed on the base plate 10.

The ESL TFT substrate shown in FIG. 1 comprises an etch stop layer (ESL) to protect a back channel from being damaged. However, due to errors of accuracy of a manufacturing process (such as alignment error of an exposure operation and line width deviation in an etching operation), the source terminal 61 and the drain terminal 62 must overlap the etch stop layer 50 by predetermined lengths L1, L3, this plus a minimum length L2 of a gap between the source terminal 61 and the drain terminal 62 that is present due to the capability of the state of the art making the actual length of the channel L the sum of L1, L2, and L3, namely L=L1+L2+L3, which is greater than the back channel length of a BCE TFT substrate. The length of the back channel of a BCE TFT is corresponding to the minimum gap length L2 between the source terminal and the drain terminal.

The greater channel length L may deteriorate the electrical conduction performance of the TFT and may also enlarge the overall size of the TFT, leading to reduction of an aperture ratio of pixels and increasing the difficult of pixel design.

SUMMARY OF THE INVENTION

An object of the present invention is to provide an ESL TFT substrate structure, which has a reduced channel length so as to, on the one hand, provide the TFT with excellent electrical conduction performance and, on the other hand, reduce the overall size of the TFT to thereby increase an aperture ratio of pixels and reduce difficult of pixel design.

An object of the present invention is also to provide a manufacturing method of an ESL TFT substrate, which reduces a channel length, improves electrical conduction performance of the TFT, and also reduces the overall size of the TFT so as to increase an aperture ratio of pixels and reduce difficult of pixel design.

To achieve the above objects, the present invention provides an ESL TFT substrate structure, which comprises:

a base plate;

a gate terminal formed on the base plate;

a gate insulation layer formed on the gate terminal and the base plate;

an oxide semiconductor layer located above the gate terminal and formed on the gate insulation layer;

an etch stop layer formed on the oxide semiconductor layer, wherein the etch stop layer comprises a first via and a second via formed therein to respectively correspond to two side portions of the oxide semiconductor layer;

a drain terminal formed on the etch stop layer and in engagement with the oxide semiconductor layer through the first via;

a passivation protection layer formed on the drain terminal and the etch stop layer, wherein the passivation protection layer comprises a through ole formed therein to extend to and communicate with the second via; and an electrode layer formed on the passivation protection layer wherein the electrode layer has one side portion that is adjacent to the drain terminal and is in engagement with the oxide semiconductor layer through the through hole and the second via to form a source terminal; and the electrode layer has an opposite side portion that is extended in a direction away from the drain terminal to form a pixel electrode.

The source terminal and the drain terminal do not overlap in a space above the gate terminal.

The source terminal and the drain terminal overlap in a space above the gate terminal.

The oxide semiconductor layer comprises a material of indium gallium zinc oxide.

The electrode layer comprises a material of indium tin oxide.

The present invention also provides an ESL TFT substrate structure, which comprises:

a base plate;

a gate terminal formed on the base plate;

a gate insulation layer formed on the gate terminal and the base plate;

an oxide semiconductor layer located above the gate terminal and formed on the gate insulation layer;

an etch stop layer formed on the oxide semiconductor layer, wherein the etch stop layer comprises a first via and a second via formed therein to respectively correspond to two side portions of the oxide semiconductor layer;

a drain terminal formed on the etch stop layer and in engagement with the oxide semiconductor layer through the first via;

a passivation protection layer formed on the drain terminal and the etch stop layer, wherein the passivation protection layer comprises a through ole formed therein to extend to and communicate with the second via; and an electrode layer formed on the passivation protection layer wherein the electrode layer has one side portion that is adjacent to the drain terminal and is in engagement with the oxide semiconductor layer through the through hole and the second via to form a source terminal; and the electrode layer has an opposite side portion that is extended in a direction away from the drain terminal to form a pixel electrode;

wherein the source terminal and the drain terminal do not overlap in a space above the gate terminal;
wherein the oxide semiconductor layer comprises a material of indium gallium zinc oxide; and
wherein the electrode layer comprises a material of indium tin oxide.

The present invention further provides a manufacturing method of a ESL TFT substrate, which comprises the following steps:

(1) providing a base plate, depositing a first metal layer on the base plate, and subjecting the first metal layer to patternization to form a gate terminal;

(2) depositing a gate insulation layer on the gate terminal and the base plate and depositing and patternizing an oxide semiconductor layer on the gate insulation layer;

(3) depositing an etch stop layer on the oxide semiconductor layer, subjecting the etch stop layer to patternization by using a gray tone mask in order to fully etch off a portion of the etch stop layer that is located above one side portion of the oxide semiconductor layer to expose a side zone of the oxide semiconductor layer for forming an extending-through first via and to partially etch off a portion of the etch stop layer that is located above an opposite side portion of the oxide semiconductor layer without exposing an opposite side zone of the oxide semiconductor layer to form a blind-hole like second via, wherein the first and second vias are spaced by a spacing distance that defines a channel length;

(4) depositing a second metal layer on the etch stop layer and subjecting the second metal layer to patternization to form a drain terminal, wherein the drain terminal is in engagement with the oxide semiconductor layer through the first via;

(5) depositing a passivation protection layer on the drain terminal and the etch stop layer and subjecting the passivation protection layer to patternization to form a through hole that extends to and communicate with the blind-hole like second via and also to complete hole through the blind-hole like second via to form an extending-through second via so as to keep the channel length unchanged; and (6) depositing and patternizing the electrode layer on the passivation protection layer in such a way that one side of the electrode layer is adjacent to the drain terminal and is set in engagement with the oxide semiconductor layer through the through hole and the second via to form a source terminal and an opposite side of the electrode layer is extended in a direction away from the drain terminal to form a pixel electrode.

Step (3) comprises the following steps:

(31) coating a photoresist layer on the etch stop layer, subjecting the photoresist layer to exposure and development by using the gray tone mask so as to obtain a full exposure area located above and corresponding to one side portion of the oxide semiconductor layer and a partial exposure area located above and corresponding to an opposite side portion of the oxide semiconductor layer;

(32) subjecting the etch stop layer to etching with the photoresist layer as a shielding layer in order to completely etch off a portion of the etch stop layer that is located below the full exposure area so as to form the extending-through first via and to partially etch off a portion of the etch stop layer that is located below the partial exposure area to form the blind-hole like second via; and (33) removing the photoresist layer.

In step (32), the etching is achieved with a dry etching operation.

The source terminal and the drain terminal do not overlap in a space above the gate terminal.

The source terminal and the drain terminal overlap in a space above the gate terminal.

The efficacy of the present invention is that the present invention provides an ESL TFT substrate structure, which comprises an electrode layer to serve as both a source terminal and a pixel electrode and which comprises a drain terminal that is located at a different layer from the source terminal so that the channel length of the TFT is reduced, whereby on the one hand, the TFT is provided with excellent electrical conduction performance and, on the other hand, the size of the TFT is reduced so as to increase an aperture ratio of pixels and reduce the difficult of pixel design. The present invention provides a manufacturing method of an ESL TFT substrate, in which a gray tone mask is first used to subject the etch stop layer to patternization in order to form an extending-through first via and a blind-hole like second via, wherein a spacing distance between the first and second vias defines a channel length, and then, a drain terminal is formed, followed by depositing and patternizing a passivation protection layer and completely holing through the blind-hole like the second via with the channel length being kept unchanged, and finally an electrode layer that serves as both a source terminal and a pixel electrode is formed, thereby the channel length is reduced; the electrical conduction performance of the TFT is improved; and the size of TFT is reduced so as to increase aperture ratio and reduce difficult of pixel design.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 2:
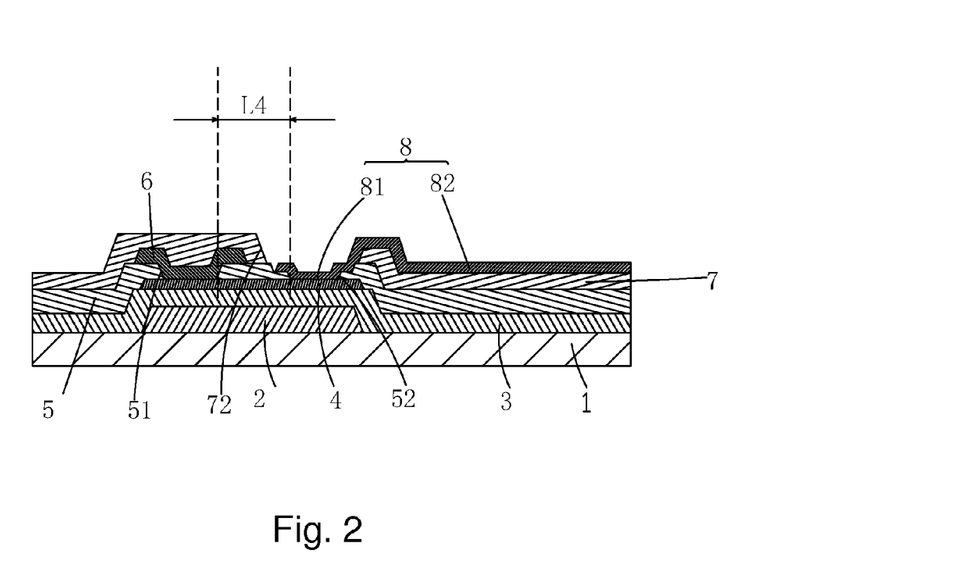
FIG. 2 is a cross-sectional view showing an ESL TFT substrate structure according to a first embodiment of the present invention.

Firstly, the present invention provides an etch stop layer (ESL) thin-film transistor (TFT) substrate structure. FIG. 2 is a schematic view illustrating an ESL TFT substrate structure according to a first embodiment of the present invention. The ESL TFT substrate structure comprises:

a base plate 1;
a gate terminal 2 formed on the base plate 1;
a gate insulation layer 3 formed on the gate terminal 2 and the base plate 1;
an oxide semiconductor layer 4 located above the gate terminal 2 and formed on the gate insulation layer 2;
an etch stop layer 5 formed on the oxide semiconductor layer 4, wherein the etch stop layer 5 comprises a first via 51 and a second via 52 formed therein to respectively correspond to two side portions of the oxide semiconductor layer 4; and the first and second vias 51, 52 are spaced by a spacing distance L4 therebetween to define a channel length;
a drain terminal 6 formed on the etch stop layer (ESL) and in engagement with the oxide semiconductor layer 4 through the first via 51;
a passivation protection layer 7 formed on the drain terminal 6 and the etch stop layer 5, wherein the passivation protection layer 7 comprises a through hole 72 formed therein to extend to and communicate with the second via 52; and
an electrode layer 8 formed on the passivation protection layer 7, wherein the electrode layer 8 has one side portion that is adjacent to the drain terminal 6 and is in engagement with the oxide semiconductor layer 4 through the through hole 72 and the second via 52 to form a source terminal 81; and the electrode layer 8 has an opposite side portion that is extended in a direction away from the drain terminal 6 to form a pixel electrode 82.

Specifically, the oxide semiconductor layer 4 comprises a material of indium gallium zinc oxide (IGZO). The electrode layer 8 comprises a material of indium tin oxide (ITO).

It is worth mentioning here that in the first embodiment illustrated in FIG. 2, the source terminal 81 and the drain terminal 6 do not overlap each other in a space above the gate terminal 2.

Figure 3:
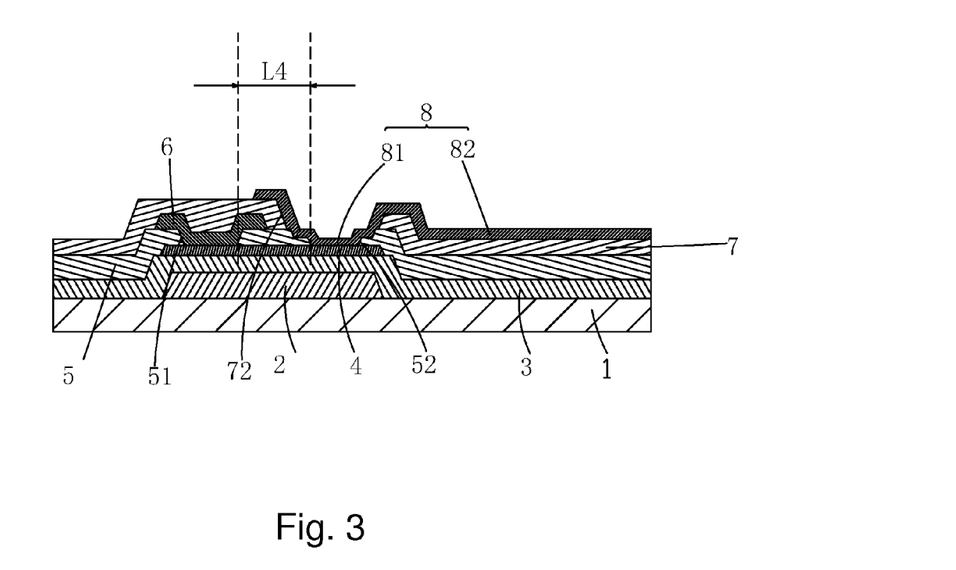
FIG. 3 is a cross-sectional view showing an ESL TFT substrate structure according to a second embodiment of the present invention.

FIG. 3 is a schematic view illustrating an ESL TFT substrate structure according to a second embodiment of the present invention. The second embodiment is different from the first embodiment kin that the source terminal 81 and the drain terminal 6 overlap each other in a space above the gate terminal 2 and thus, the requirement for accuracy of a manufacturing process of the electrode layer 8 is relatively low. The remaining is the same as the first embodiment and repeated description will be not necessary.

The present invention provides an ESL TFT substrate structure, which comprises an electrode layer 8 to serve as both a source terminal 81 and a pixel electrode 82 and which comprises a drain terminal 6 that is located at a different layer from the source terminal 81 so that the channel length of the TFT is defined as the spacing distance L4 between the first and second vias 51, 52 and is smaller than the channel length of a conventional ESL TFT substrate, whereby on the one hand, the TFT is provided with excellent electrical conduction performance and, on the other hand, the size of the TFT is reduced so as to increase an aperture ratio of pixels and reduce the difficult of pixel design.

Figure 4:
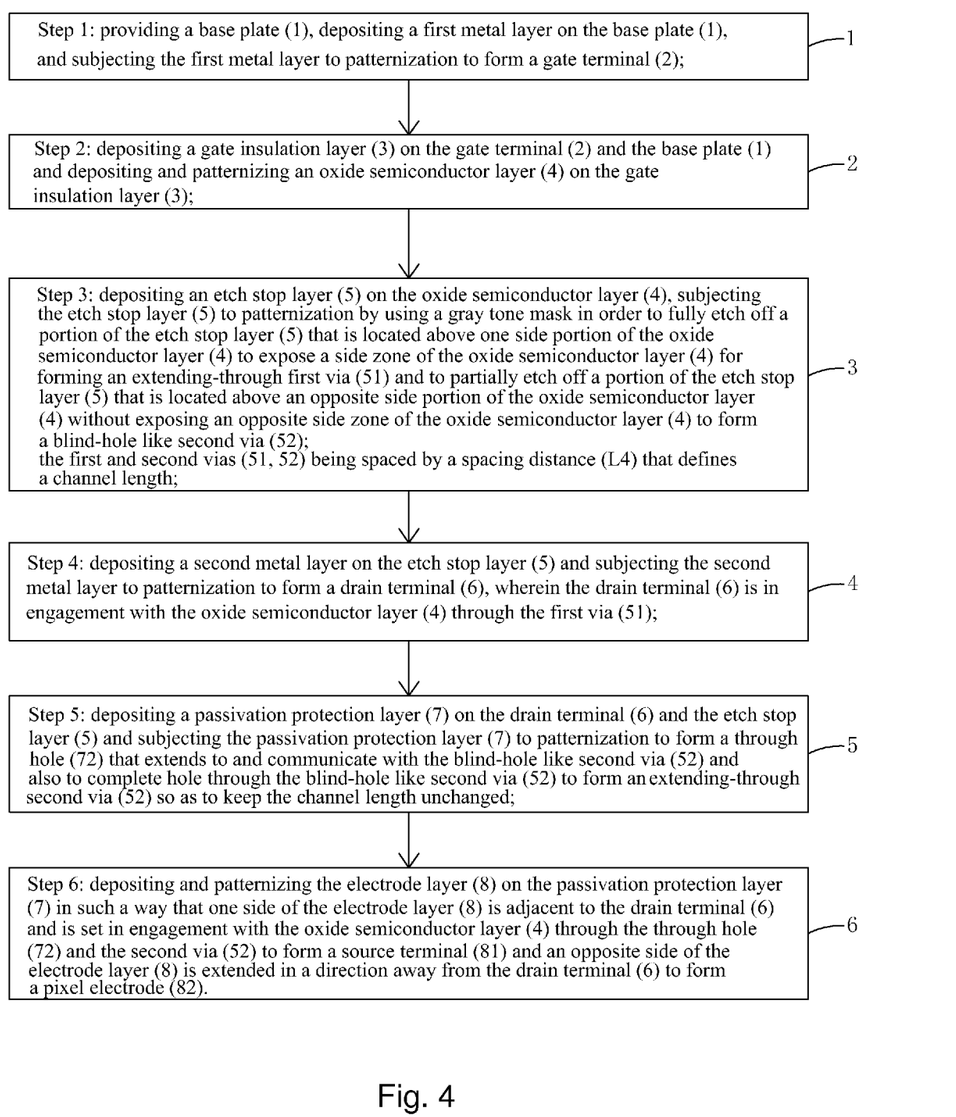
FIG. 4 is a flow chart illustrating a manufacturing method of an ESL TFT substrate according to the present invention.
Figure 5:
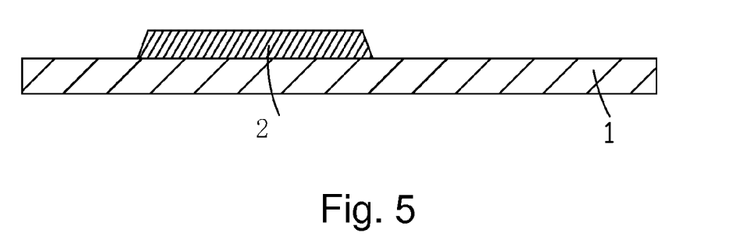
FIG. 5 is a schematic view illustrating a first step of the manufacturing method of the ESL TFT substrate according to the present invention.

Referring to FIG. 4, the present invention also provides a manufacturing method of an ESL TFT substrate, which comprises the following steps:

Step 1: as shown in FIG. 5, providing a base plate 1, depositing a first metal layer on the base plate 1, and subjecting the first metal layer to patternization to form a gate terminal 2.

Figure 6:
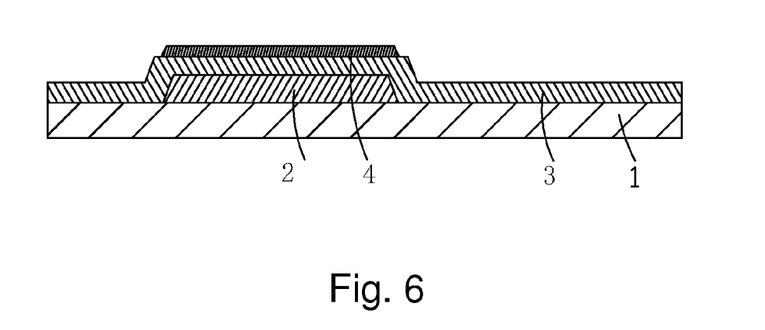
FIG. 6 is a schematic view illustrating a second step of the manufacturing method of the ESL TFT substrate according to the present invention.

Step 2: as shown in FIG. 6, depositing a gate insulation layer 3 on the gate terminal 2 and the base plate 1 and depositing and patternizing an oxide semiconductor layer 4 on the gate insulation layer 3.

Specifically, the oxide semiconductor layer 4 comprises a material of IGZO.

Figure 7:
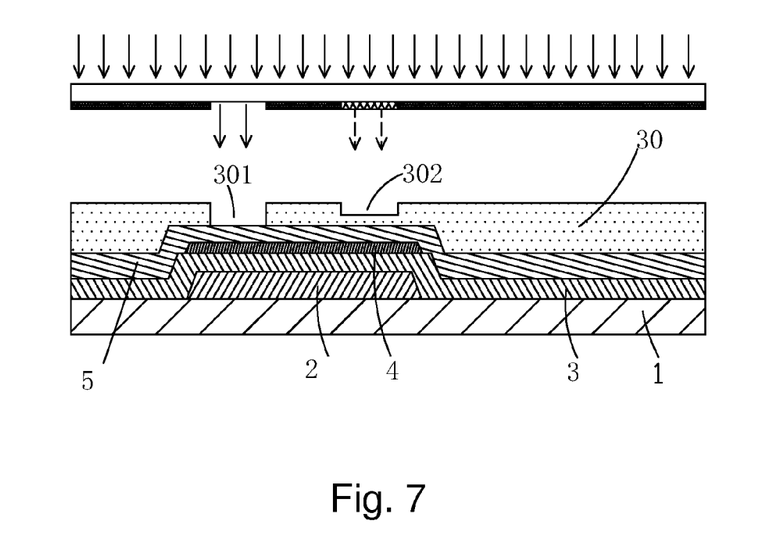
FIGS. 7-9 are schematic views illustrating a third step of the manufacturing method of the ESL TFT substrate according to the present invention.
Figure 8:
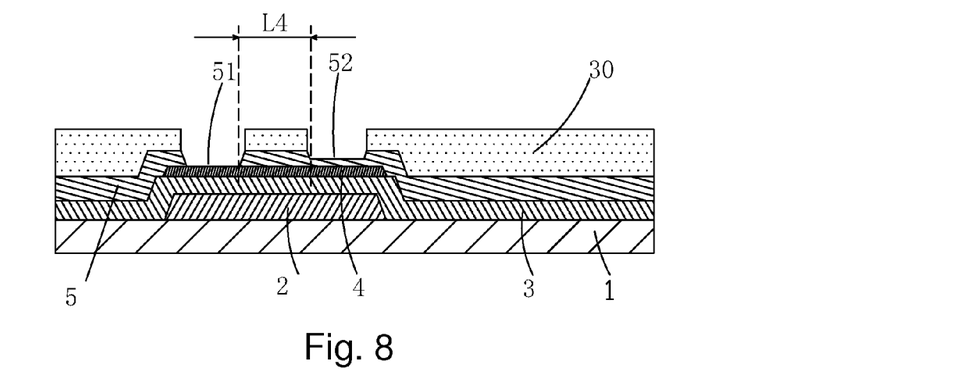
Figure 9:
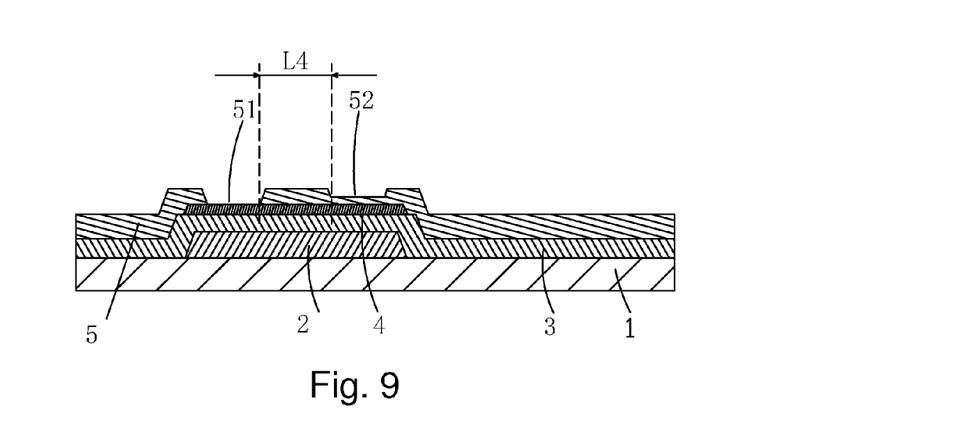

Step 3: as shown in FIGS. 7-9, depositing an etch stop layer 5 on the oxide semiconductor layer 4, subjecting the etch stop layer 5 to patternization by using a gray tone mask in order to fully etch off a portion of the etch stop layer 5 that is located above one side portion of the oxide semiconductor layer 4 to expose a side zone of the oxide semiconductor layer 4 for forming an extending-through first via 51 and to partially etch off a portion of the etch stop layer 5 that is located above an opposite side portion of the oxide semiconductor layer 4 without exposing an opposite side zone of the oxide semiconductor layer 4 to form a blind-hole like second via 52. The first and second vias 51, 52 are spaced by a spacing distance L4 that defines a channel length.

Specifically, Step 3 comprises the following steps:

Step 31: as shown in FIG. 7, coating a photoresist layer 30 on the etch stop layer 5, subjecting the photoresist layer 30 to exposure and development by using the gray tone mask so as to obtain a full exposure area 301 located above and corresponding to one side portion of the oxide semiconductor layer 4 and a partial exposure area 302 located above and corresponding to an opposite side portion of the oxide semiconductor layer 4.

Step 32: as shown in FIG. 8, subjecting the etch stop layer 5 to etching with the photoresist layer 30 as a shielding layer in order to completely etch off a portion of the etch stop layer 5 that is located below the full exposure area 301 so as to form the extending-through first via 51 and to partially etch off a portion of the etch stop layer 5 that is located below the partial exposure area 302 to form the blind-hole like second via 52.

Step 33: as shown in FIG. 9, removing the photoresist layer 30.

Figure 10:
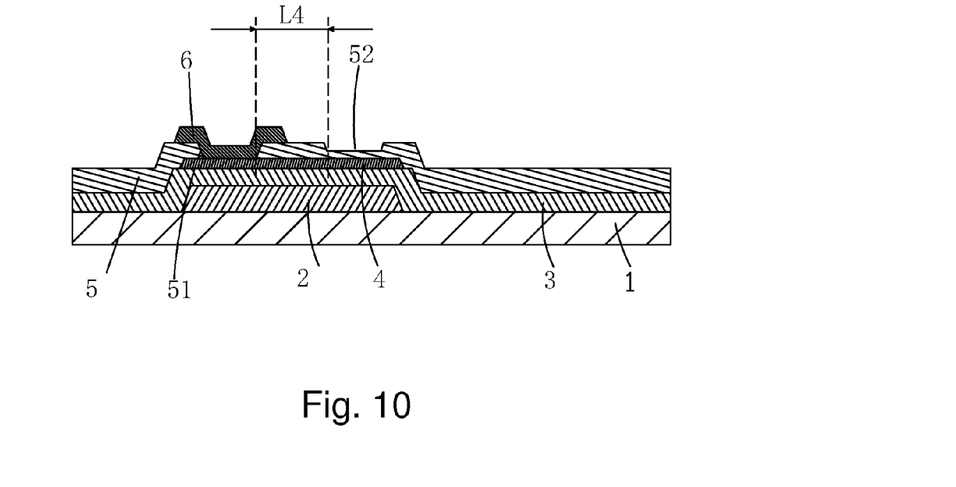
FIG. 10 is a schematic view illustrating a fourth step of the manufacturing method of the ESL TFT substrate according to the present invention.

Step 4: as shown in FIG. 10, depositing a second metal layer on the etch stop layer 5 and subjecting the second metal layer to patternization to form a drain terminal 6, wherein the drain terminal 6 is in engagement with the oxide semiconductor layer 4 through the first via 51.

Figure 11:
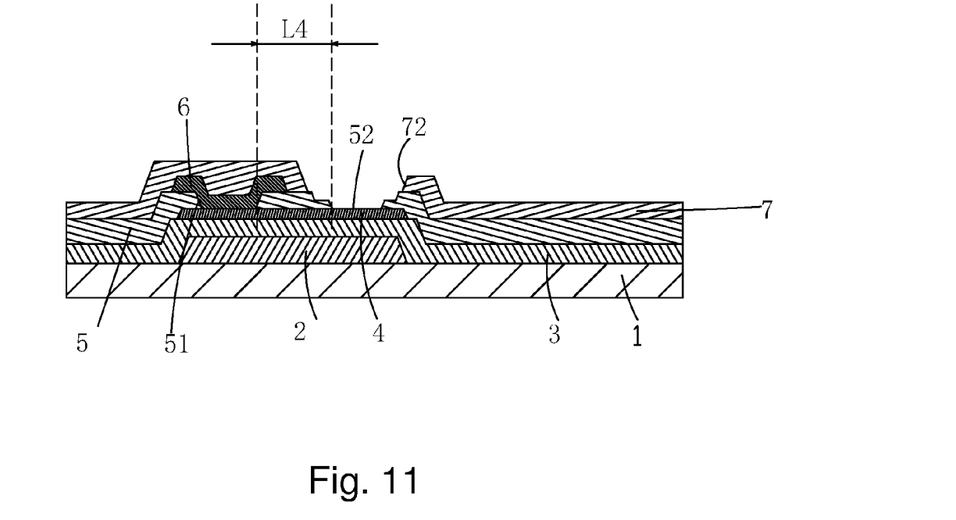
FIG. 11 is a schematic view illustrating a fifth step of the manufacturing method of the ESL TFT substrate according to the present invention.

Step 5: as shown in FIG. 11, depositing a passivation protection layer 7 on the drain terminal 6 and the etch stop layer 5 and subjecting the passivation protection layer 7 to patternization to form a through hole 72 that extends to and communicate with the blind-hole like second via 52 and also to complete hole through the blind-hole like second via 52 to form an extending-through second via 52 so as to keep the channel length unchanged.

Figure 12:
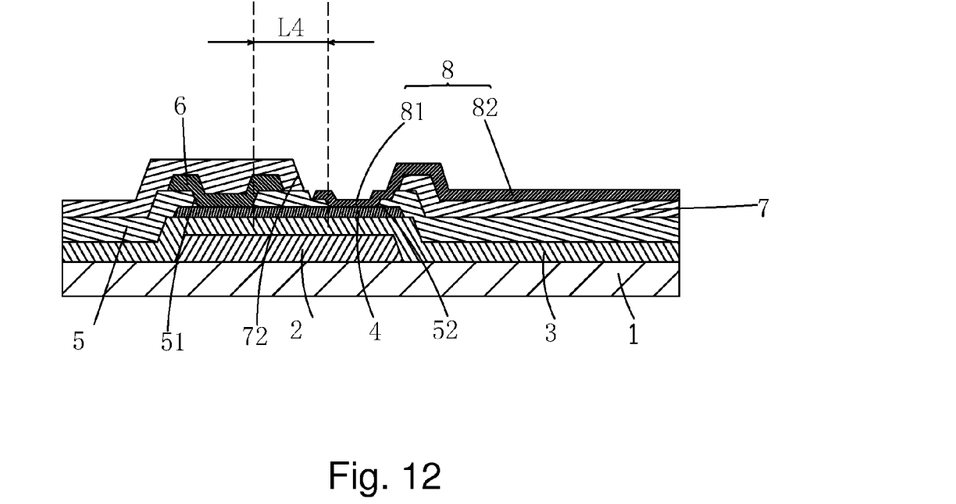
FIG. 12 is a schematic view illustrating a sixth step of the manufacturing method of the ESL TFT substrate according to the present invention.

Step 6: as shown in FIG. 12, depositing and patternizing the electrode layer 8 on the passivation protection layer 7 in such a way that one side of the electrode layer 8 is adjacent to the drain terminal 6 and is set in engagement with the oxide semiconductor layer 4 through the through hole 72 and the second via 52 to form a source terminal 81 and an opposite side of the electrode layer 8 is extended in a direction away from the drain terminal 6 to form a pixel electrode 82.

Specifically, the electrode layer 8 comprises a material of ITO.

FIG. 12 schematically illustrates the source terminal 81 and the drain terminal 6 do not overlap each other in a space above the gate terminal 2. It is, however, obvious that due to limitations imposed by accuracy of manufacturing operations, the source terminal 81 and the drain terminal 6 may overlap each other in a space above the gate terminal 2 as shown in FIG. 3.

In the above-described manufacturing method of an ESL TFT substrate, a gray tone mask is first used to subject the etch stop layer 5 to patternization in order to form an extending-through first via 51 and a blind-hole like second via 52, wherein a spacing distance L4 between the first and second vias 51, 52 defines a channel length, and then, a drain terminal 6 is formed, followed by depositing and patternizing a passivation protection layer 7 and completely holing through the blind-hole like the second via 52 with the channel length being kept unchanged, and finally an electrode layer that serves as both a source terminal 81 and a pixel electrode 82 is formed, thereby the channel length is reduced; the electrical conduction performance of the TFT is improved; and the size of TFT is reduced so as to increase aperture ratio and reduce difficult of pixel design.

In summary, the present invention provides an ESL TFT substrate structure, which comprises an electrode layer to serve as both a source terminal and a pixel electrode and which comprises a drain terminal that is located at a different layer from the source terminal so that the channel length of the TFT is reduced, whereby on the one hand, the TFT is provided with excellent electrical conduction performance and, on the other hand, the size of the TFT is reduced so as to increase an aperture ratio of pixels and reduce the difficult of pixel design. The present invention provides a manufacturing method of an ESL TFT substrate, in which a gray tone mask is first used to subject the etch stop layer to patternization in order to form an extending-through first via and a blind-hole like second via, wherein a spacing distance between the first and second vias defines a channel length, and then, a drain terminal is formed, followed by depositing and patternizing a passivation protection layer and completely holing through the blind-hole like the second via with the channel length being kept unchanged, and finally an electrode layer that serves as both a source terminal and a pixel electrode is formed, thereby the channel length is reduced; the electrical conduction performance of the TFT is improved; and the size of TFT is reduced so as to increase aperture ratio and reduce difficult of pixel design.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An etch stop layer (ESL) thin-film transistor (TFT) substrate structure, comprising:
    a base plate;
    a gate terminal formed on the base plate;
    a gate insulation layer formed on the gate terminal and the base plate;
    an oxide semiconductor layer located above the gate terminal and formed on the gate insulation layer;
    an etch stop layer formed on the oxide semiconductor layer, wherein the etch stop layer comprises a first via and a second via formed therein to respectively correspond to two side portions of the oxide semiconductor layer;
    a drain terminal formed on the etch stop layer and in engagement with the oxide semiconductor layer through the first via;
    a passivation protection layer formed on the drain terminal and the etch stop layer, wherein the passivation protection layer comprises a through ole formed therein to extend to and communicate with the second via; and
    an electrode layer formed on the passivation protection layer wherein the electrode layer has one side portion that is adjacent to the drain terminal and is in engagement with the oxide semiconductor layer through the through hole and the second via to form a source terminal; and the electrode layer has an opposite side portion that is extended in a direction away from the drain terminal to form a pixel electrode;
    wherein the second via is delimited by a circumferential wall that has an upper portion and a lower portion that are spaced sideways from each other to define therebetween a step.

2. The ESL TFT substrate structure as claimed in claim 1, wherein the source terminal and the drain terminal do not overlap in a space above the gate terminal.

3. The ESL TFT substrate structure as claimed in claim 1, wherein the source terminal and the drain terminal overlap in a space above the gate terminal.

4. The ESL TFT substrate structure as claimed in claim 1, wherein the oxide semiconductor layer comprises a material of indium gallium zinc oxide.

5. The ESL TFT substrate structure as claimed in claim 1, wherein the electrode layer comprises a material of indium tin oxide.

6. An etch stop layer (ESL) thin-film transistor (TFT) substrate structure, comprising:
    a base plate;
    a gate terminal formed on the base plate;
    a gate insulation layer formed on the gate terminal and the base plate;
    an oxide semiconductor layer located above the gate terminal and formed on the gate insulation layer;
    an etch stop layer formed on the oxide semiconductor layer, wherein the etch stop layer comprises a first via and a second via formed therein to respectively correspond to two side portions of the oxide semiconductor layer;
    a drain terminal formed on the etch stop layer and in engagement with the oxide semiconductor layer through the first via;
    a passivation protection layer formed on the drain terminal and the etch stop layer, wherein the passivation protection layer comprises a through ole formed therein to extend to and communicate with the second via; and
    an electrode layer formed on the passivation protection layer wherein the electrode layer has one side portion that is adjacent to the drain terminal and is in engagement with the oxide semiconductor layer through the through hole and the second via to form a source terminal; and the electrode layer has an opposite side portion that is extended in a direction away from the drain terminal to form a pixel electrode;

wherein the second via is delimited by a circumferential wall that has an upper portion and a lower portion that are spaced sideways from each other to define therebetween a step;

wherein the source terminal and the drain terminal do not overlap in a space above the gate terminal;

wherein the oxide semiconductor layer comprises a material of indium gallium zinc oxide; and wherein the electrode layer comprises a material of indium tin oxide.

* * * * *